(12) United States Patent
Puche et al.

(10) Patent No.: US 11,994,544 B2
(45) Date of Patent: May 28, 2024

(54) COMPENSATING FOR DRIFT IN A SWITCH GEAR VOLTAGE SENSOR

(71) Applicant: G & W Electric Company, Bolingbrook, IL (US)

(72) Inventors: Juan Serrano Puche, Chicago, IL (US); Blair S. Kerr, Downers Grove, IL (US); Stefan Micic, Bolingbrook, IL (US)

(73) Assignee: G & W Electric Company, Bolingbrook, IL (US)

(*) Notice: Subject to any disclaimer, the term of this patent is extended or adjusted under 35 U.S.C. 154(b) by 0 days.

(21) Appl. No.: 17/448,148

(22) Filed: Sep. 20, 2021

(65) Prior Publication Data

US 2023/0089470 A1    Mar. 23, 2023

(51) Int. Cl.
*G01R 19/25* (2006.01)
*G01R 15/04* (2006.01)
*G01R 15/16* (2006.01)

(52) U.S. Cl.
CPC ......... *G01R 19/2513* (2013.01); *G01R 15/16* (2013.01); *G01R 15/04* (2013.01)

(58) Field of Classification Search
CPC ............................. G01R 19/2513; G01R 15/04
See application file for complete search history.

(56) References Cited

U.S. PATENT DOCUMENTS

| | | | | |
|---|---|---|---|---|
| 5,136,234 A * | 8/1992 | Shaw | ..................... | G01R 15/04 324/72 |
| 5,534,782 A * | 7/1996 | Nourse | ................ | H02H 11/005 361/60 |
| 2002/0190705 A1 * | 12/2002 | Skendzic | ............. | G01R 15/142 324/127 |
| 2003/0067295 A1 * | 4/2003 | Bierer | .................. | G01R 15/144 324/142 |
| 2012/0019965 A1 * | 1/2012 | Faxvog | ..................... | H02H 3/52 361/627 |
| 2014/0021965 A1 * | 1/2014 | De Rybel | ............... | G01R 15/16 324/632 |
| 2014/0266260 A1 | 9/2014 | Wurzinger et al. | | |

(Continued)

OTHER PUBLICATIONS

Canadian Patent Office Action for Application No. 3197276 dated Jul. 6, 2023 (06 pages).

(Continued)

*Primary Examiner* — Alexander Satanovsky
*Assistant Examiner* — Sharah Zaab
(74) *Attorney, Agent, or Firm* — Michael Best & Friedrich LLP (57) ABSTRACT

A system and method for compensating for drift in a switch gear voltage sensor. The system includes a circuit, and an electronic processor. The circuit is configured to receive a first signal from a first capacitor of the voltage sensor and receive a second signal from a second capacitor of the voltage sensor. The circuit is further configured to generate a third signal and a fourth signal based on the first signal and the second signal. The electronic processor is configured to receive the third signal and the fourth signal and determine an angular frequency, a phase difference, a resistance value, a voltage across a compensation capacitor, an initial gain, a capacitance of the second capacitor, a capacitance and a voltage of the compensation capacitor, and a final gain.

20 Claims, 6 Drawing Sheets

(56) References Cited

U.S. PATENT DOCUMENTS

| | | |
|---|---|---|
| 2014/0300374 A1 | 10/2014 | Mckenzie et al. |
| 2018/0284178 A1* | 10/2018 | Brychta ................. G01R 31/54 |
| 2020/0159266 A1 | 5/2020 | Kerr et al. |
| 2020/0233017 A1 | 7/2020 | Kerr |
| 2020/0333385 A1 | 10/2020 | Wang et al. |

OTHER PUBLICATIONS

International Search Report and Written Opinion for Application No. PCT/US2022/076592 dated Jan. 10, 2023 (8 pages).
Canadian Patent Office Action for Application No. 3197276 dated Jan. 25, 2024 (4 pages).

* cited by examiner

| Test # | Real C1_2 pF | Real C1_1 pF | Real R1 (Ohm) | Real C2 (nF) | Measurement Error(B) | Measurement Error Frequency% (f) | Gain Error (%) | Average Output Steady State Error (%) |
|---|---|---|---|---|---|---|---|---|
| 1 | 25 | 20 | 250000 | 120 | 0 | 0 | 0 | 4e-5 |
| 2 | 25.25 | 20.2 | 250000 | 120 | 0 | 0 | 0 | 2e-2 |
| 3 | 25.75 | 20.6 | 250000 | 120 | 0 | 0 | 0 | 1.7e-2 |

COMPENSATING FOR DRIFT IN A SWITCH GEAR VOLTAGE SENSOR

BACKGROUND

Electrical power distribution systems have transmission and distribution voltages that range from 2,400 volts to 100 kilovolts and, in some cases, even higher voltages (so-called "high voltage" systems). Voltage sensors used in high voltage monitoring systems are typically used in combination with circuits or other components that scale down high voltages so that the voltages can be measured using components rated for lower voltages. Many voltage sensors utilize epoxy as a primary dielectric material in one or more capacitive components. These capacitive components, sometimes simply referred to as capacitors, may form a capacitive voltage divider that is part of or used in conjunction with a voltage sensor and that scales down the voltage.

SUMMARY

Due to change in the permittivity of epoxy over time, a voltage sensor that uses a capacitor with an epoxy dielectric may be subject to voltage drift. Voltage drift can lead to measurement inaccuracies. Embodiments described herein address, among other things, voltage sensor accuracy drifting beyond a predetermined accuracy threshold, for example, beyond 0.5% over time due to changes in permittivity. Among other things, embodiments described herein provide a capacitive voltage sensor compensation system that compensates for drift in capacitance that may be caused by dielectric material property changes.

Some embodiments provide, among other things, a system for compensating for drift in a switch gear voltage sensor. The system includes an electronic processor configured to receive a first signal and a second signal, determine an angular frequency of the first signal, determine a phase difference between the first signal and the second signal, determine a resistance value based on the angular frequency and the phase difference, and determine a capacitor voltage across a compensation capacitor. The electronic processor is also configured to determine an initial gain based on a line voltage, a capacitance of a second capacitor, a capacitance of the compensation capacitor, and the capacitor voltage, and determine a final gain based on the resistance value, the angular frequency, and the phase difference.

Another embodiment provides a system for compensating for drift in a switch gear voltage sensor that includes a measurement circuit. The circuit includes a compensation capacitor and a measurement resistor. The circuit is configured to receive a first signal from a first capacitor of the voltage sensor at the measurement resistor and receive a second signal from a second capacitor of the voltage sensor at the compensation capacitor. The circuit generates a third signal based on the first signal and a fourth signal based on the second signal. The system also includes an electronic processor configured to receive the third signal and the fourth signal. Based on the third signal and the fourth signal, the electronic processor determines an angular frequency of the third signal and determines a phase. The electronic processor also determines a resistance value based on the angular frequency and the phase difference and determines a capacitor voltage across the compensation capacitor. Based on a line voltage, a capacitance of the second capacitor, a capacitance of the compensation capacitor, and the capacitor voltage, the electronic processor determines an initial gain. Based on the resistance value, the angular frequency, and the phase difference, the electronic processor determines a final gain and determines a drift value based on the final gain.

Another embodiment provides a method for compensating for drift in a switch gear voltage sensor. The method includes receiving, at a circuit, a first signal from a first capacitor of the voltage sensor, and receiving, via the circuit, a second signal from a second capacitor of the voltage sensor. The method also includes generating, via the circuit, a third signal based on the first signal, and generating, via the circuit, a fourth signal (V2) based on the second signal. The method also includes receiving the third signal and the fourth signal via an electronic processor and determining an angular frequency of the third signal and a phase difference between the third and fourth signal with the electronic processor. The method also includes determining, with the electronic processor, a resistance value based on the angular frequency and the phase difference, determining a capacitor voltage across a compensation capacitor, determining an initial gain based on a line voltage, a capacitance of the second capacitor, a capacitance of the compensation capacitor, and the capacitor voltage, determining a final gain based on the resistance value, the angular frequency, and the phase difference, and determining a drift value based on the final gain.

Other aspects and embodiments will become apparent by consideration of the detailed description and accompanying drawings.

DETAILED DESCRIPTION

Before any embodiments are explained in detail, it is to be understood that the disclosure is not intended to be limited in its application to the details of construction and the arrangement of components set forth in the following description or illustrated in the following drawings. Embodiments are capable of other configurations and of being practiced or of being carried out in various ways.

A plurality of hardware and software-based devices, as well as a plurality of different structural components may be used to implement various embodiments. In addition, embodiments may include hardware, software, and electronic components or modules that, for purposes of discussion, may be illustrated and described as if most of the components were implemented solely in hardware. However, one of ordinary skill in the art, and based on a reading of this detailed description, would recognize that, in at least one embodiment, the electronic based aspects of the invention may be implemented in software (for example, stored on non-transitory computer-readable medium) executable by one or more electronic processors. For example, "control units" and "controllers" described in the specification can include one or more electronic processors, one or more memory modules including non-transitory computer-readable medium, one or more input/output interfaces, one or more application specific integrated circuits (ASICs), and various connections (for example, a system bus) connecting the various components.

It also should be understood that although certain drawings illustrate hardware and software located within particular devices, these depictions are for illustrative purposes only. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links.

Figure 1A:
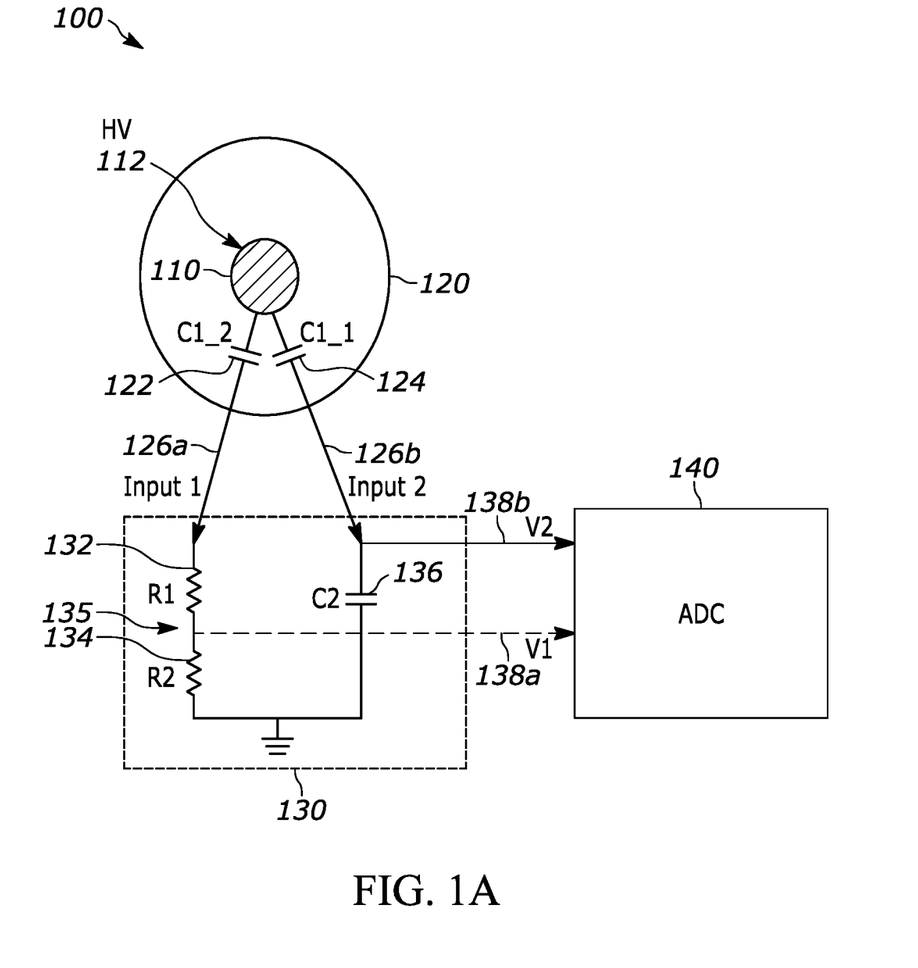
FIG. 1A is a block diagram of a system for measuring voltage at a high voltage electrode, according to some embodiments.

FIG. 1A is a block diagram of a system 100 for measuring voltage at a high voltage electrode 110, for example, the electrode of a recloser, a switch, or switchgear used in an electrical power distribution system according to some embodiments. The high voltage electrode 110 may be electrically coupled to a high voltage source, for example, a transmission or distribution line of an electrical power distribution system. According to some embodiments, the system 100 includes a voltage sensor 120. In some embodiments, the voltage sensor 120 is a high voltage epoxy casting switchgear sensor.

Figure 1B:
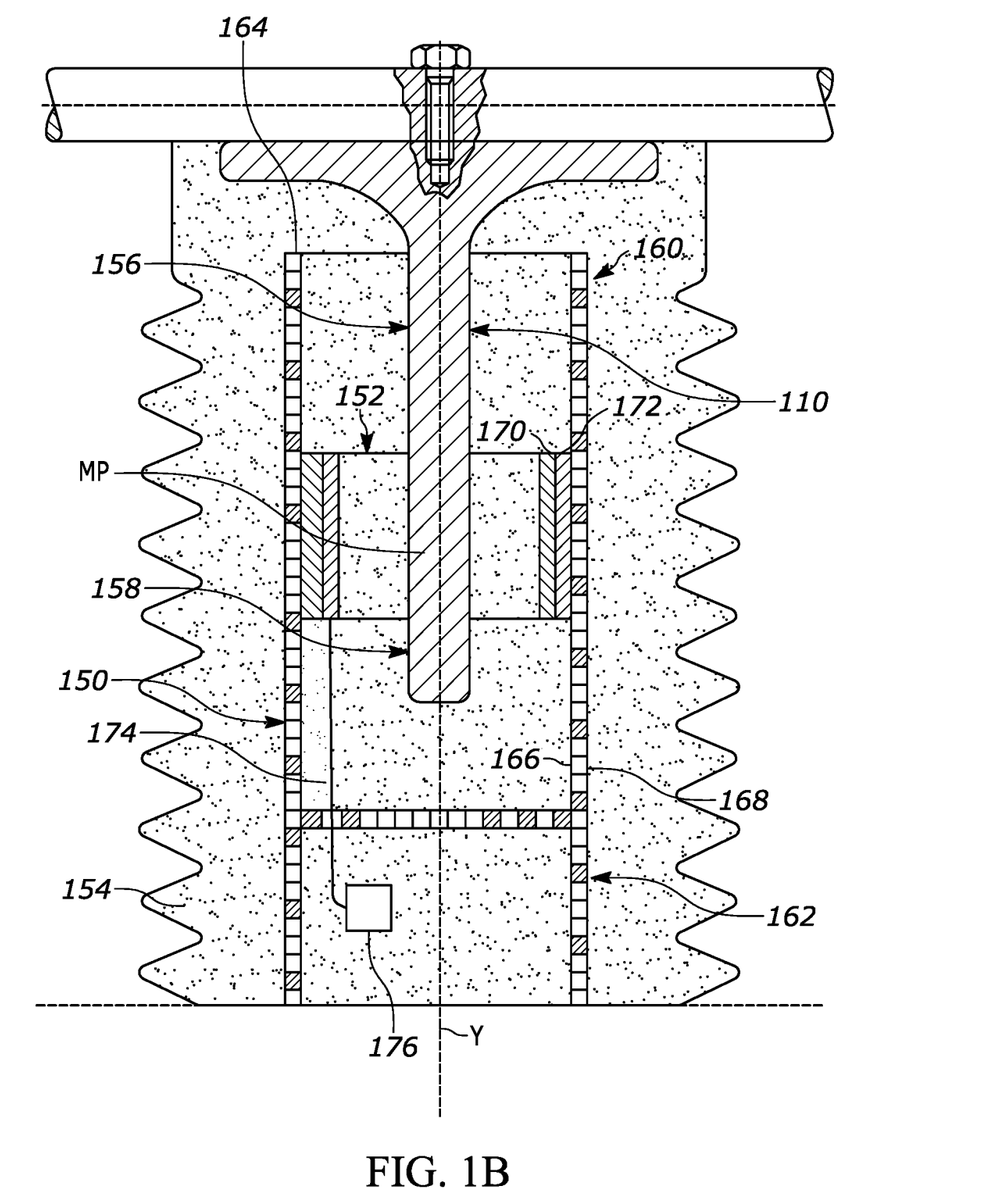
FIG. 1B is an illustrative example of a voltage sensor, according to some embodiments.

FIG. 1B illustrates a voltage sensor, such as the voltage sensor 120. In the example shown. The voltage sensor 120 includes a source electrode, such as the electrode 110, a shielding element or tubular body 150, an electric field sensor 152, and a mass of dielectric insulating material 154 (for example, epoxy).

The electrode 110 has an elongated shape extending longitudinally along a longitudinal axis Y and includes a first axial end portion 156 and a second axial end portion 158. The second axial end portion 158 is located opposite to the first axial end portion 156.

The shielding tubular body 150 has an elongate shape extending longitudinally along a longitudinal axis Y. The shielding tubular body 150 includes a first axial end portion 160 and a second opposite axial end portion 162. The shielding tubular body 150 is preferably grounded and shields the electric field sensor 152 with respect to electromagnetic fields generated by live conductors positioned externally to the voltage sensor 120. Shielding helps reduce interference. As a consequence, the field sensor 152 detects electromagnetic fields generated by the electrode 110 with little, if any, detection of electromagnetic fields created by external sources, including external conductors. The shielding tubular body 150 includes a tubular mantle 164. The mantle 164 includes an inner face 166 and an outer face 168.

The electric field sensor 152 is radially spaced with respect and around the electrode 110 as well as positioned within the tubular body 150 and preferably positioned in an intermediate point (MP) between the first axial end portion 160 and the second axial end portion 162 of the shielding tubular body 150.

In the example illustrated, the shielding tubular body 150, the electrode 110, and the electric field sensor 152, are incorporated within the mass of dielectric insulating material 154.

In the example shown, the electric field sensor 152 includes at least one first inner sheet 170 and a second external sheet 172 which are superimposed and joined together, preferably as a monolithic structure. In one embodiment, the first inner sheet 170 is made from or includes an electrically conductive material (metallic) and the second external sheet 172 is made from or includes an electrically insulating material. In one embodiment, the second external sheet 172 is preferably bonded to the inner face 166 of the shielding tubular body 150, for example, by glue points positioned on the outer face of the sheet 168 and on the inner face 166 of the sheet. Due to its conductive nature, the first inner sheet 170 is able to detect an electromagnetic field generated by the electrode 110. In addition, a capacitive coupling is formed (i.e., a capacitance exists) between the electrode 110 and the first inner sheet 166.

Changes in the capacitance of the capacitive coupling between the electrode 110 and the electric field sensor 152 cause changes in the electric field generated by the electrode 110. A signal representing these changes can be transmitted via a cable 174 to a processing device 176, such as the microcontroller 210.

Returning to FIG. 1A, the voltage sensor 120 includes a first capacitor 122 (C1_2) and a second capacitor 124 (C1_1). In the embodiment illustrated in FIG. 1, the first capacitor 122 (C1_2) represents a first capacitor formed by the electrode 110 and the first inner sheet 166 and the second capacitor 124 (C1_1) represent a second capacitor by the electrode 110 and the first inner sheeb 166. The first capacitor 122 (C1_2) generates a first signal 126a (Input 1) a based on a line voltage 112 (HV) received from the high voltage electrode 110. The second capacitor 124 (C1_1) a second signal 116b (Input 2) based on the line voltage 112 (HV) received from the high voltage electrode 110.

In some embodiments, the voltage sensor 120 is electrically coupled to a capacitive voltage sensor compensation system 130. The capacitive voltage sensor compensation system 130 includes a voltage divider 135 (including a measurement resistor 132 (R1) and a divider resistor 134 (R2) electrically coupled in series). The first capacitor 122 (C1_2) is electrically coupled in series to the voltage divideb 135 and provides the first signal 126a (Input 1) to the voltage divider 135. The second capacitor 124 (C1_1) is electrically coupled in series to the compensation capacitor 136 and provides the second signal 126b (Input 2) to the compensation capacitor 136. According to some embodiments, the system 100 includes an analog-to-digital converter 140 that receives and converts the third signal 138a (V1) and the fourth signal 138b (V2) from an analog signal to a digital signal.

Figure 2:
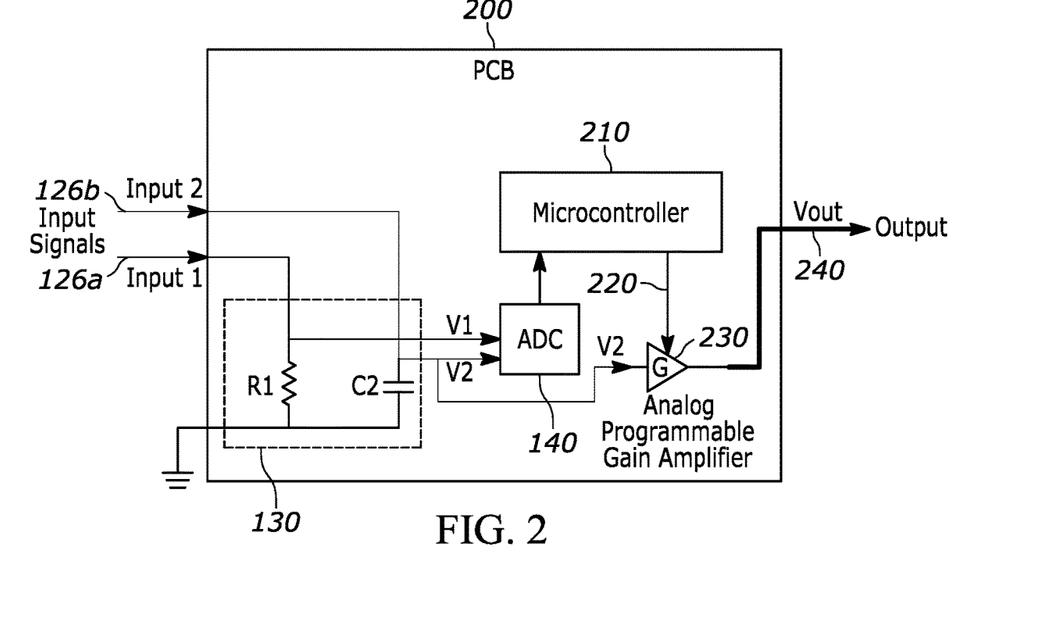
FIG. 2 is a circuit diagram of a system for compensating for drift in a voltage sensor, according to some embodiments.

FIG. 2 is a circuit diagram of a system 200 for compensating for drift in a voltage sensor, such as the voltage sensor 120, according to some embodiments. In some embodiments, the system 200 receives the first signal 126a (Input 1) and the second signal 126b (Input 2) at the capacitive voltage sensor compensation system 130. The capacitive voltage sensor compensation system 130 generates the third signal 138a (V1) and the fourth signal 138b(V2). The capacitive voltage sensor compensation system 130 provides the third signal 138a (V1) and the fourth signal 138b (V2) to the analog-to-digital converter 140. The analog-todigital converter 140 generates a digital signal based on the third signal 138a (V1) and the fourth signal 138b (V2) and provides the generated digital signal to an electronic processor, which in the illustrated embodiment is microcontroller 210. The microcontroller 210 generates an output 220 that is provided to a programmable gain amplifier 230. The programmable gain amplifier generates an output voltage 240 (Vout) based on receiving the output 220 and the fourth signal 138b (V2). Operation of the microcontroller 210 and output 220 is discussed in greater detail with respect to FIG. 3.

Figure 3:
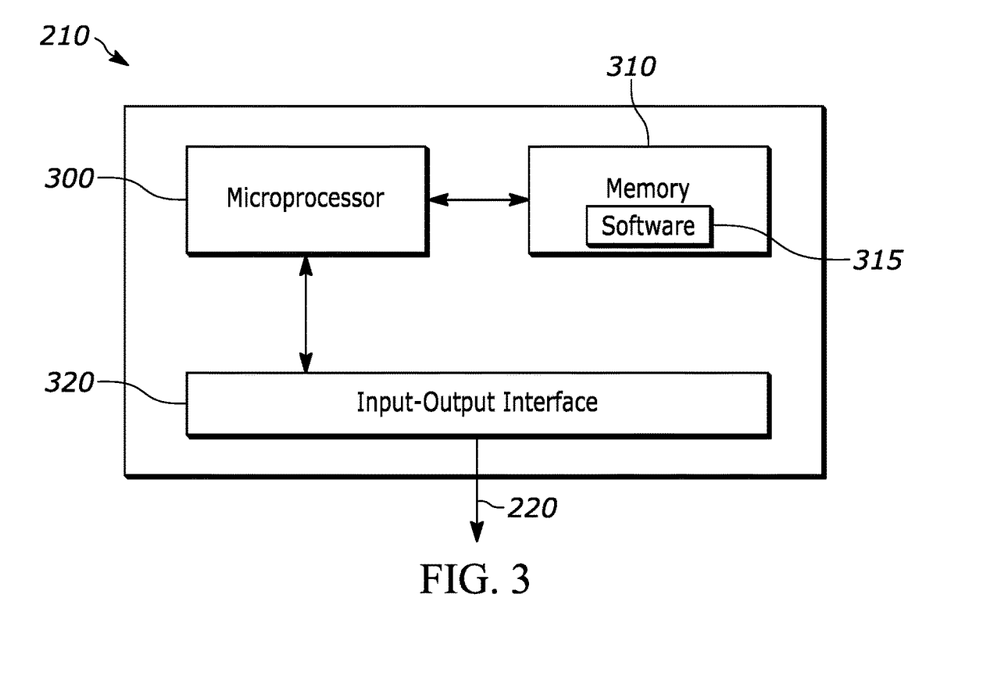
FIG. 3 is an illustrative example of a microcontroller, according to some embodiments.

FIG. 3 illustrates the microcontroller 210 in greater detail. In the example illustrated, the microcontroller 210 includes a microprocessor 300 (such as a programmable electronic microprocessor, or similar device), a memory 310 (for example, non-transitory, machine-readable memory), software 315, and an input-output interface 320. The microprocessor 300 is communicatively connected to the memory 310 and the input-output interface 320. In certain embodiments, the microprocessor 300, in coordination with the memory 310 and the input-output interface 320, is configured to implement, among other things, the methods described herein.

In some embodiments, the memory 310 stores information about one or more numerical values associated with or derived from the high voltage electrode 110, the line voltage 112 (HV), the first capacitor 122 (C1_2), the second capacitor 124 (C1_1), the first signal 126a (Input 1), the second signal 126b (Input 2), the measurement resistor 132 (R1), the divider resistor 134 (R2), the compensation capacitor 136 (C2), the third signal 138a (V1), and/or the fourth signal 138b (V2). In some embodiments, software 315 is stored in the memory 310 and includes instructions which, when executed by the microprocessor 300, determine one or more numerical values associated with or derived from the high voltage electrode 110, the line voltage 112, the first capacitor 122 (C1_2), the second capacitor 124 (C1_1), the first signal 126a (Input 1), the second signal 126b (Input 2), the measurement resistor 132 (R1), the divider resistor 134 (R2), the compensation capacitor 136 (C2), the third signal 138a (V1), and/or the fourth signal 138b (V2) based on the digital signal generated by the analog-to-digital converter 140.

In some embodiments, via the software 315 executed by the microprocessor 300, the microcontroller 210 determines:

an angular frequency of the third signal 138a (V1) based on $$\omega = 2\pi f \quad \text{(Equation 1)}$$

where
$\omega$=angular frequency of the third signal 138a (V1), and
f=measured frequency of the line voltage 112 (HV).

a voltage value for the third signal 138a (V1) based on $$\frac{HVL0 * R_2}{R + \frac{1}{j\omega C_{1\_2}}} = V_1 < B \quad \text{(Equation 2)}$$

where
HV=voltage of the line voltage 112 (HV),
$R_2$=resistance of the second resistor 134 (R2),
R=resistance of the voltage divider 135 consisting of the first resistor 132 (R1) and the second resistor 134 (R2),
$\omega$=angular frequency of the third signal 138a (V1),
$C_{1\_2}$=capacitance of the first capacitor 122 (C1_2),
$V_1$=voltage of the third signal 138a (V1), and B=measured phase difference of the third signal 138a (V1) and the fourth signal 138b (V2).

a voltage value for the fourth signal 138b (V2) based on $$\frac{HV * C_{1\_1}}{C_{1\_1} + C_2} = V_2 \quad \text{(Equation 3)}$$

where
HV=voltage of the line voltage 112 (HV),
$C_{1\_2}$=capacitance of the first capacitor 122 (C1_2),
$C_{1\_1}$=capacitance of the second capacitor 124 (C1_1),
$C_2$=capacitance of the compensation capacitor 136 (C2), and
$V_2$=voltage of the fourth signal 138b a capacitance of the first capacitor 122 (C1_2) based on (C1_2) based on $$\frac{1}{R * \omega * \tan(B)} = C_{1\_2} \quad \text{(Equation 4)(Derived from Equation 2)}$$

where
R=resistance of the voltage divider 135 consisting of the first resistor 132 (R1) and the second resistor 134 (R2),
$\omega$=angular frequency of the third signal 138a (V1),
B=measured phase difference of the third signal 138a (V1) and the fourth signal 138b (V2), and
$C_{1\_2}$=capacitance of the first capacitor 122 (C1_2).

a normalized value of R, setting $C_{1\_2}$=1 in Equation 4, based on $$\frac{1}{\omega * \tan B} = R_n \quad \text{(Equation 5)}$$

where
$\omega$=the angular frequency of the third signal 138a (V1),
B=measured phase difference of the third signal 138a (V1) and the fourth signal 138b (V2), and
$R_n$=the normalized value of R a desired voltage ratio of the compensation capacitor 136 (C2) and the second capacitor 124 (C1_1) based on $$\frac{C_2}{C_{1\_1}} = A \quad \text{(Equation 6)}$$

where
$c_2$=nominal capacitance of the compensation capacitor 136 (C2),
$C_{1\_1}$=nominal capacitance of the second capacitor 124 (C1_1), and
A=the desired voltage ratio.

an initial output gain ($G_{initial}$) based on $$\frac{HV}{A * V_2} = G_{initial} \quad \text{(Equation 7)}$$

where
HV=voltage of the line voltage 112 (HV),
A=the desired voltage ratio,
$V_2$=voltage of the fourth signal 138b (V2), and
$G_{initial}$=the initial output gain a final output gain ($G_{final}$) based on $$R_n * \omega * \tan(B) = G_{final}$$

where
$R_n$=the normalized value of R,
$\omega$=angular frequency of the third signal 138a (V1),
B=measured phase difference of the third signal 138a (V1) and the fourth signal 138b (V2), and
$G_{final}$=final output gain.
a normalized capacitor drift value based on $$\frac{1}{G_{final}} = D \quad \text{(Equation 9)}$$

and an output voltage based on $$G_{initial} * G_{final} * \frac{C_{1\_1} * D}{C_2} * HV = V_{out} \quad \text{(Equation 10)}$$

As described above, the microcontroller 210 is configured to generate the output 220. In some embodiments, the output 220 is generated based on one or more of determining, via the microprocessor 300, an angular frequency of the third signal 138a (V1) (Equation 1), a voltage value of the third signal 138a (V1) (Equation 2), a voltage value of the fourth signal 138b (V2) (Equation 3), a capacitance of the first capacitor 122 (C1_2) (Equation 4), a normalized resistance value (Equation 5), a desired voltage ratio (Equation 6), an initial output gain (Equation 7), a final output gain (Equation 8), a normalized capacitor drift value (D) (Equation 9), and/or an output voltage (Equation 10). In other embodiments, the output 220 is generated based on one or more numerical values stored in the memory 310. While the output 220 is discussed herein as being generated based on, in part, determining specific values via the microprocessor 300 and, in part, in part receiving specific values at the microprocessor 300 from the memory 310, it is to be understood that the output 220 may be generated entirely based on values determined by the microprocessor 300 or entirely based on values previously determined by the microprocessor 300 and stored in the memory 310. For example, during a calibration of the system 200, the microprocessor 300 may determine one or more values to be stored in the memory 310. At a later time, such during a field operation of the system 200, the microprocessor 300 may retrieve the one or more values from the memory 310.

In some embodiments, the system 200 needs to be calibrated before drift can be properly compensated, oftentimes, a known high voltage is applied during calibration of the system 200. In one embodiment, the microcontroller 210 receives the third signal 138a (V1) and the fourth signal 138b (V2) from the capacitive voltage sensor compensation system 130. The software 315, when executed by the microprocessor 300, receives a numerical value associated with the angular frequency ($\omega$) of the third signal 138a (V1) and a numerical value associated with the phase difference (B) of the third signal 138a (V1) and the fourth signal 138b (V2) from the memory 310. Based on the angular frequency ($\omega$) and the phase difference (B), the microprocessor 300 determines a normalized resistance value ($R_n$) using Equation 5. The software 315 also receives a numerical value associated with the line voltage 112 (HV), a numerical value associated with a capacitance of the first capacitor 122 (C1_2), a numerical value associated with a capacitance of the second capacitor 124 (C1_1), and a numerical value associated with a capacitance of the compensation capacitor 136 (C2). Based on the line voltage 112 (HV), the capacitance of the first capacitor 122 (C1_2), the capacitance of the second capacitor 124 (C1_1), and the capacitance of the compensation capacitor 136 (C2), the microprocessor 300 determines a voltage value of the fourth signal 138b (V2) according Equation 3. In some embodiments, the microprocessor 300 determines the voltage value of the fourth signal 138b (V2) based on a signal received from the analog-to-digital converter 140. In some embodiments, the desired voltage ratio (A) is chosen during the design of the system 200 and is provided to the microprocessor 300. For example, the nominal (ideal) capacitance values of the second capacitor 124 (C1_1) and the compensation capacitor 136 (C2) are selected to result in the ideal voltage ratio (A) during design of the system 200. Based on the line voltage 112 (HV), the desired voltage ratio (A), and the voltage value of the fourth signal 138b (V2), the microprocessor 300 determines an initial gain output ($G_{initial}$) according to Equation 7. The microcontroller generates the output 220 based on the initial gain output ($G_{initial}$) and provides the output 220 to the programmable gain amplifier 230. In some embodiments, the second capacitor 124 (C1_1) and the compensation capacitor 136 (C2) may have tolerances which result in the initial voltage ratio obtained not being the desired voltage ratio (A). Thus, the initial gain output ($G_{initial}$) obtained during calibration is a correction factor which results in the output 220 meeting the desired voltage ratio (A).

In some embodiments, the microcontroller 210 receives the third signal 138a (V1) and the fourth signal 138b (V2) from the capacitive voltage sensor compensation system 130. The software 315, when executed by the microprocessor 300, receives a numerical value associated with the normalized resistance value ($R_n$), a numerical value associated with the angular frequency ($\omega$) of the third signal 138a (V1), a numerical value associated with the phase difference (B) of the third signal 138a (V1) and the fourth signal 138b (V2) from the memory 310. Based on the normalized resistance value ($R_n$), the angular frequency ($\omega$), the phase difference (B), the microprocessor 300 determines a normalized value of the first capacitor 122 (C1_2) where R=$R_n$. Based on the normalized resistance value ($R_n$), the angular frequency ($\omega$), the phase difference (B), the microprocessor 300 determines a final output gain ($G_{final}$) according Equation 8. Based on the final output gain ($G_{final}$), the microprocessor 300 determines a normalized capacitor drift value (D) according to Equation 9. The microcontroller generates the output 220 based on the initial gain output ($G_{initial}$) and the final gain output ($G_{final}$) and provides the output 220 to the programmable gain amplifier 230. The programmable gain amplifier 230 generates the output voltage 240 (Vout) with a voltage value according to Equation 10.

Returning to FIGS. 1 and 2, in some embodiments, the first capacitor 122 (C1_2) is used as a reference capacitor. Changes in permittivity of the epoxy encasing the first capacitor 122 (C1_2) and the second capacitor 124 (C1_1) are expected to affect capacitance values of both capacitors at the same rate. Therefore, by determining a change in capacitance of the first capacitor 122 (C1_2), one can assume a similar capacitance change in the second capacitor 124 (C1_1). Accordingly, a normalized value of the first capacitor 122 (C1_2) is determined so any change in the capacitance of the first capacitor 122 (C1_2) is represented as a percentage change. For example, with a normalized capacitance value C1_2=1, if the capacitance of the first capacitor 122 (C1_2) increases by 1%, the normalized capacitance value would be C1_2=1.01. Accordingly, by determining a 1% increase in the capacitance of the first capacitor 122 (C1_2) has occurred, one can assume that the capacitance of the second capacitor 124 (C1_1) has also increased by 1% as the capacitances of both capacitors are expected to drift at the same rate. Thus, according to some embodiments, the final output gain ($G_{final}$), determined by the microcontroller 210, represents a gain that compensates the fourth signal 138b (V2) so that it is not affected by drift. In other words, the fourth signal 138b (V2) (e.g., a sensed voltage value from the voltage sensor 120) may be affected by drift and, therefore, inaccurate. The microcontroller 210 determines the amount of drift based on the third signal 138a (V1) (e.g., a reference voltage value from the voltage sensor 120) and provides the output 220 to the programmable gain amplifier 230 which compensates the fourth signal 138b (V2), generating the voltage output 240 (Vout) (e.g., a compensated voltage value that is accurate to the line voltage 112).

Figure 4:
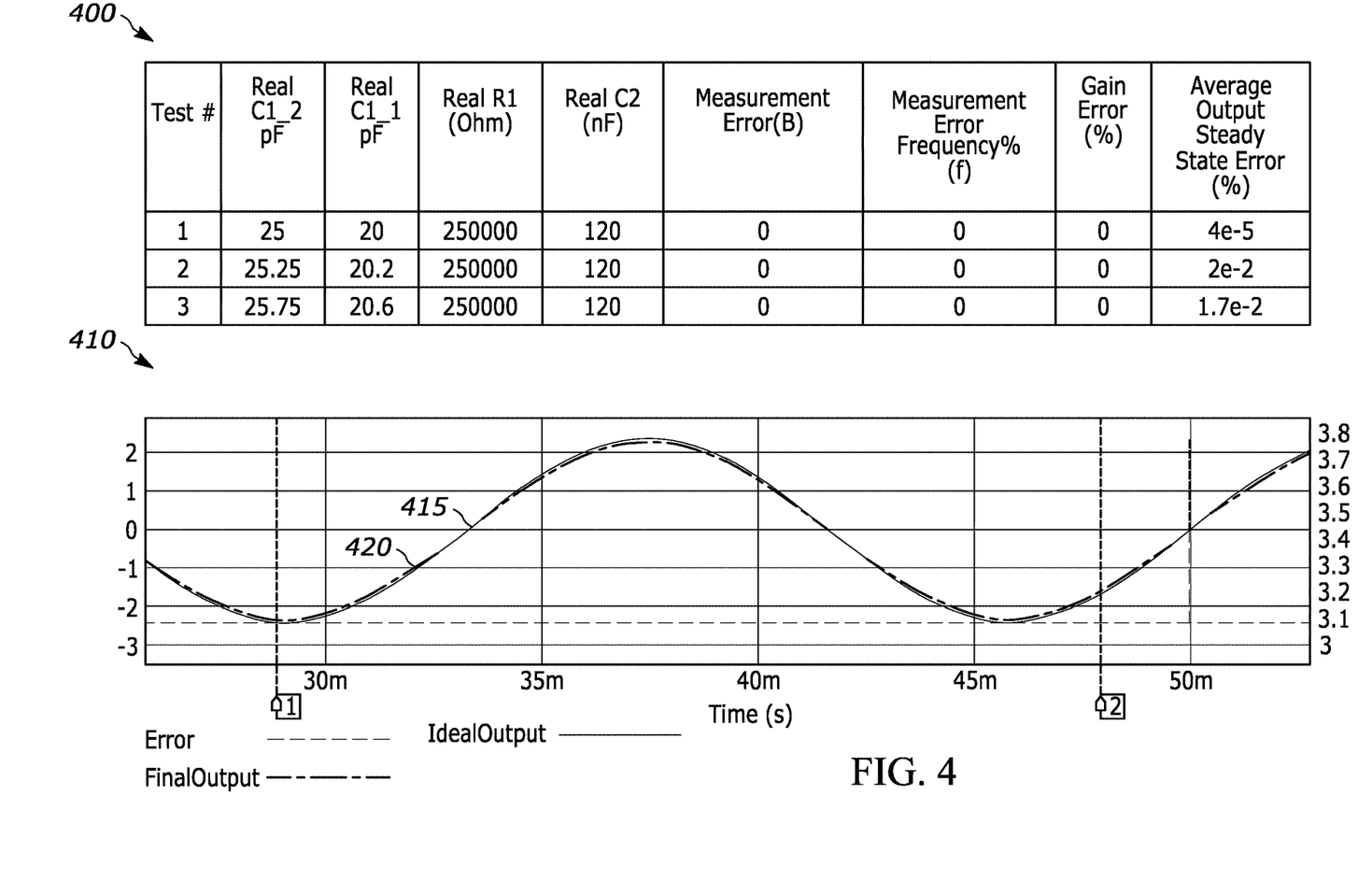
FIG. 4 is an illustrative example of simulation results of the system illustrated in FIG. 2, according to some embodiments.

FIG. 4 is an illustrative example of simulation results of the system 200, according to some embodiments. Table 400 illustrates several test cases in which a capacitance of the first capacitor 122 (C1_2), a capacitance of the second capacitor 124 (C1_1), a resistance of the first resistor 132 (R1), a capacitance of the compensation capacitor 136 (C2), a phase angle (B) measurement error, a frequency (f) measurement error, a gain error, and an average output steady state error are determined. The average output steady state error represents the percentage error between a value of the output voltage 240 (Vout) generated by the system 200 and the actual voltage to be measured (e.g., line voltage 112). For example, the average output steady state error may be calculated by the equation:

$$\text{Error} = \frac{\frac{HV}{A} - Vout}{\frac{HV}{A}} \quad \text{(Equation 11)}$$

Error=the average output steady state error,
HV=the line voltage 112,
A=the desired voltage ratio (A), and
$V_{out}$=the output voltage 240.

Returning to FIG. 4, test case 1 represents an instance in which the first capacitor 122 (C1_2) (having a capacitance of 25 pF) and the second capacitor 124 (C1_1) (having a capacitance of 20 pF) are not affected by drift. In test case 1, the average output steady state error is 4e-5%. Test case 2 represents an instance in which the first capacitor 122 (C1_2) (having a capacitance of 25.25 pF) and the second capacitor 124 (C1_1) (having a capacitance of 20.2 pF) have increased in capacitance and are affected by drift. In test case 2, the average output steady state error is 2e-2%. Test case 3 represents an instance in which the first capacitor 122 (C1_2) (having a capacitance of 25.75 pF) and the second capacitor 124 (C1_1) (having a capacitance of 20.6 nF) have further increased in capacitance and are further affected by drift. In test case 3, the average output steady state error is 1.7e-2%. Graph 410 illustrates an example visual representation of a test case. In graph 410, the x-axis represents a time value and the y-axis represents a voltage value. The line 415 represents an ideal output voltage value (e.g., a voltage value accurate to the voltage sensed by the voltage sensor 120). The line 420 represents a final output generated by generated by the system 200 (e.g., the voltage output 240 (Vout)).

Figure 5:
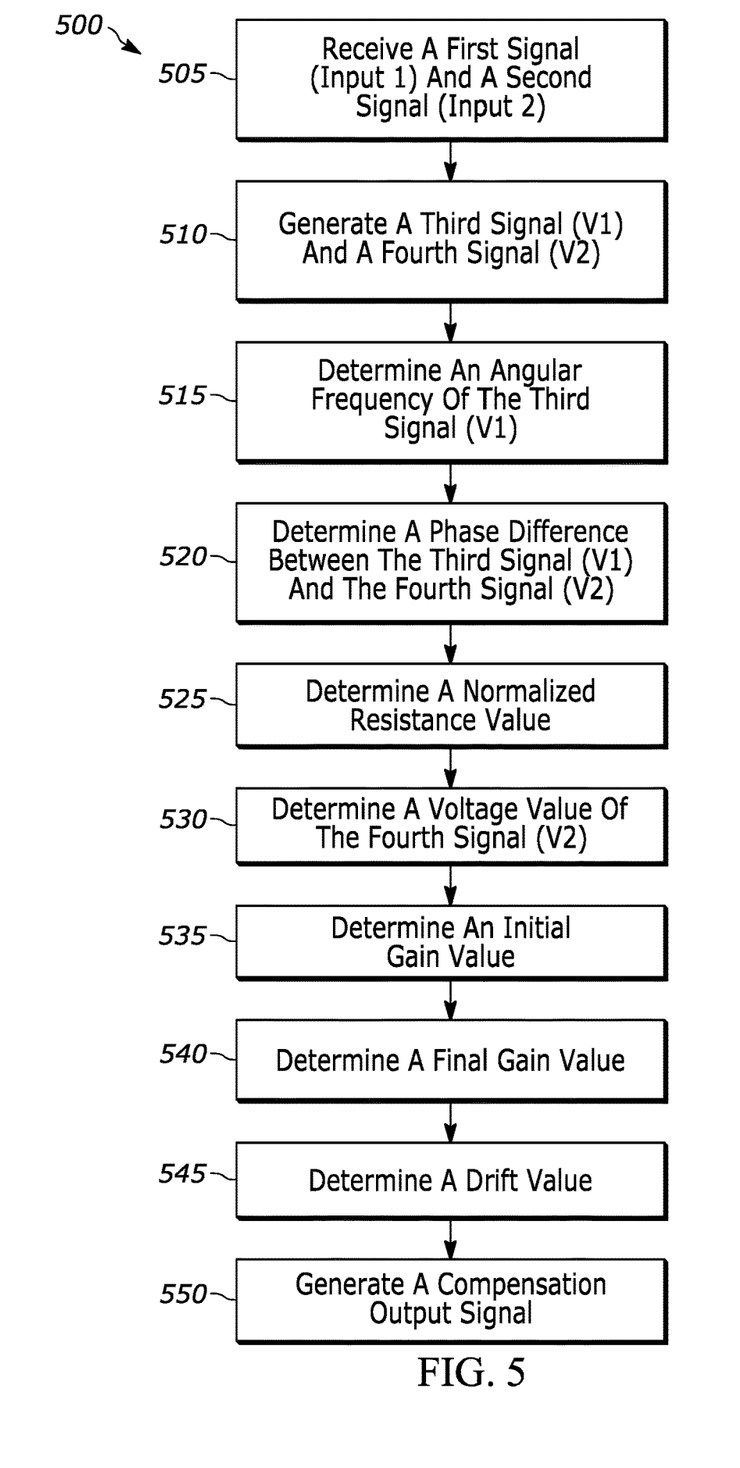
FIG. 5 is a first example method for operating a system for compensating for drift in a voltage sensor, according to some embodiments.

FIG. 5 is an example of a method 500 for operating a system for compensating for drift in a voltage sensor, such as the system 200, according to some embodiments. In some embodiments, the method begins with a calibration of the system 200. For example, the method 500 may begin at block 505, wherein the microcontroller 210 receives the first signal 126a, generated by the first capacitor 122 (C1_2) of the voltage sensor 120, and the second signal 126b, generated by the second capacitor 124 (C1_1) of the voltage sensor 120.

At block 510, the voltage divider 135 generates a third signal 138a (V1) representing the voltage across the measurement resistor 132 (R1), and a fourth signal 138b (V2) representing a voltage across the compensation capacitor 136 (C2).

At block 515, the microcontroller 210 determines an angular frequency of the third signal 138a (V1). In some embodiments, the microcontroller 210 determines the angular frequency based on a frequency of the third signal 138a (V1) stored in the memory 310. In some embodiments, the microcontroller 210 determines the angular frequency based on receiving a measured angular frequency value from the input-output interface 320. In other embodiments, the microcontroller 210 determines the angular frequency based on one or more instructions stored in the memory 310), such as the software 315, based on Equation 1, and executed by the microprocessor 300.

At block 520, the microcontroller 210 determines a phase difference between the third signal 138a (V1) and the fourth signal 138b (V2). At block 525, the microcontroller 210 determines a normalized resistance value. In some embodiments, the microcontroller 210 determines the normalized resistance value based on receiving the normalized resistance value from the memory 310.

At block 530, the microcontroller 210 determines the voltage value of the fourth signal 138b (V2). At block 535, the microcontroller 210 determines an initial gain value. In some embodiments, calibration of the system 200 is complete after determining the initial gain value at block 535. After calibration, the system 200 may begin operating in an in-field mode of operation at block 540. At block 540, the microcontroller 210 determines a final gain value.

At block 545, the microcontroller 210 determines a drift value.

At block 550, the microcontroller 210 generates a compensation output signal. The compensation output represents, for example, the output 220 and is provided to the programmable gain amplifier 230. The compensation output signal is based on one or both of the initial gain value determined at block 535 and the final gain value determined at block 540.

In some embodiments, the microcontroller 210 determines one or more of the phase difference, the normalized resistance value, the voltage value of the fourth signal 138b (V2), the initial gain value, the final gain value, and the drift value based on data from the memory 310. In some embodiments, the microcontroller 210 determines one or more of the phase difference, the normalized resistance value, the voltage value of the fourth signal 138b (V2), the initial gain value, the final gain value, and the drift value based on measurement data from the input-output interface 320. In other embodiments, the microcontroller 210 determines one or more of the phase difference, the normalized resistance value, the voltage value of the fourth signal 138b (V2), the initial gain value, the final gain value, and the drift value based on one or more instructions stored in the memory 310, such as the software 315, and executed by the microprocessor 300.

In some embodiments, the microcontroller 210 may perform all (or any portion) of the method 500 described above. In other embodiments, the method 500 may be performed by a combination of the microcontroller 210 and one or more similar devices.

Figure 6:
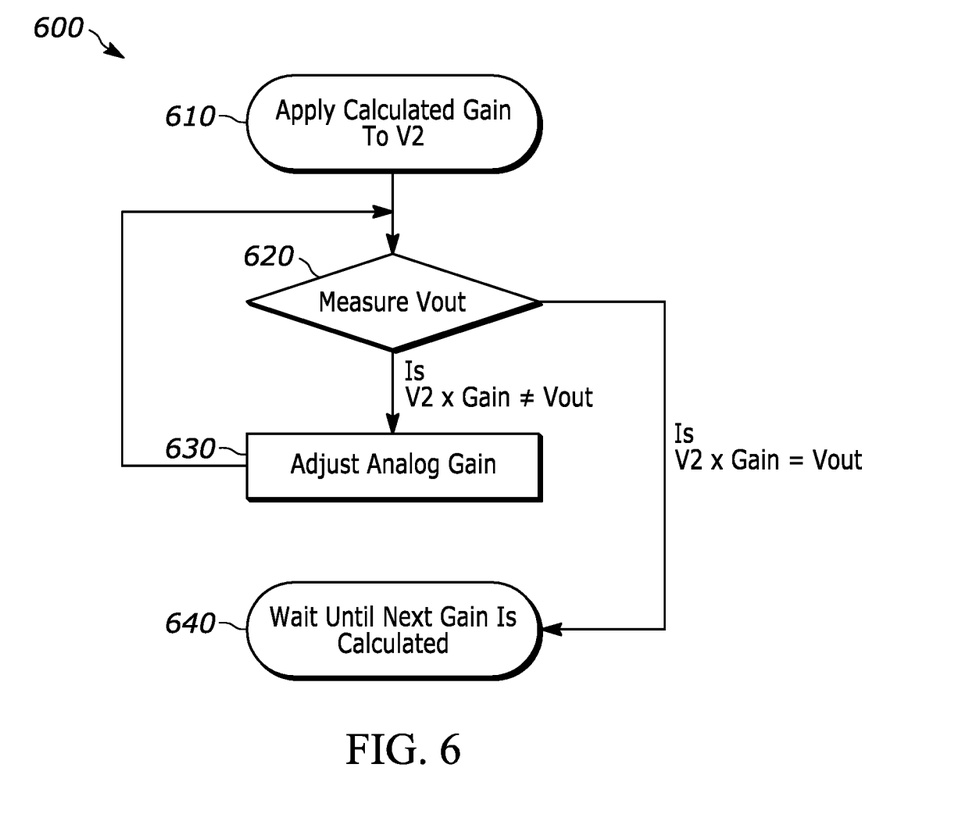
FIG. 6 is an example of a method for operating a programmable gain amplifier, according to some embodiments.

FIG. 6 is an example of a method 600 for operating a programmable gain amplifier, such as the programmable gain amplifier 230, according to some embodiments. Before the method 600 begins, the programmable gain amplifier receives the fourth signal 138b (V2) from the capacitive voltage sensor compensation system 130, and receives one or both of the initial gain value determined at block 535 and the final gain value determined at block 540 of FIG. 5.

At step 610, the programmable gain amplifier 230 applies a determined gain (e.g., one or both of the initial gain value determined at block 535 and the final gain value determined at block 540) to the fourth signal 138b (V2).

At step 620, the voltage output 240 (Vout) generated by the programmable gain amplifier 230 is measured. When the voltage output 240 (Vout) is not equal to the fourth signal 138b (V2) multiplied by the determined gain, the method 600 continues to step 630.

At step 630, the determined gain value is adjusted and the method 600 returns to step 620. The method 600 may repeat step 620 and 630 until the voltage output 240 (Vout) is equal to the fourth signal 138b (V2) multiplied by the determined gain.

When the voltage output 240 (Vout) is equal to the fourth signal 138b (V2) multiplied by the determined gain, the method 600 continues to step 640. At step 640, the programmable gain amplifier 220 waits for another determined gain. For example, the microcontroller 210 may determine that the capacitance of the first capacitor 122 (C1_2) has changed due to a change in the permittivity of the epoxy of the voltage sensor 120, thus the microcontroller determines a second value for the final gain (e.g., a second determined gain value) based on Equation 8 and provides the second value for the final gain to the programmable gain amplifier 220. It is to be understood that while the method 600 is discussed herein as only applying a first determined gain value and applying a second determined gain value to the fourth signal 138b (V2), the microcontroller 210 can determine numerous gain values to be applied to the fourth signal 138b (V2) via the programmable gain amplifier 220. In some embodiments, the microcontroller 210 is configured to determine and provide a new gain value to the programmable gain amplifier 220 after determining a change in the capacitance of the first capacitor 122 (C1_2). In some embodiments, the microcontroller 210 is configured to determine and provide a new gain value to the programmable gain amplifier 230 on a periodic basis. In other embodiments, the microcontroller 210 is configured to determine and provide a new gain value to the programmable gain amplifier 230 whenever the system 200 is powered on.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The phrase "electrically coupled in series" as used herein refers to a circuit arrangement in which the described elements are arranged, in general, in a sequential fashion such that the output of one element is electrically coupled to the input of another, though the same current may not pass through each element. For example, additional circuit elements may be electrically coupled in parallel with one or more of the elements "electrically coupled in series." Furthermore, additional circuit elements can be electrically connected in series at nodes such that branches in the circuit are present. Therefore, elements electrically coupled in series do not necessarily form a true series circuit.

Additionally, the phrase "electrically coupled in parallel" as used herein refers to a circuit arrangement in which the described elements are arranged, in general, in a manner such that one element is electrically coupled to another element, such that the circuit forms a parallel branch of the circuit arrangement. In such a configuration, the individual elements of the circuit may not have the same potential difference across them individually. For example, in a parallel-type configuration of the circuit, two circuit elements electrically coupled in parallel with one another may be electrically coupled in series with one or more additional elements of the circuit. Therefore, elements electrically coupled in parallel do not necessarily individually form a true parallel circuit.

It will be appreciated that some embodiments may be comprised of one or more generic or specialized processors (or "processing devices"), for example, microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising an electronic processor) to perform a method as described and claimed herein. Examples of such computer-readable storage mediums include, but are not limited to, a hard disk, a CD-ROM, an optical storage device, a magnetic storage device, a ROM, a programmable read-only memory (PROM), an EEPROM, an erasable programmable read-only memory (EPROM), and a Flash memory.

Various features and advantages are set forth in the following claims.

We claim:

1. A system for compensating for drift in a switch gear voltage sensor, the system comprising:
   a circuit including a compensation capacitor and a voltage divider including a measurement resistor and a divider resistor, the compensation capacitor being in parallel with the voltage divider, the circuit configured to
      receive, at the measurement resistor, a first signal (Input 1) from a first capacitor of the voltage sensor (C1_2) formed by an electrode and an inner electrically conductive sheet of the switch gear voltage sensor, receive, at the compensation capacitor, a second signal (Input 2) from a second capacitor of the voltage sensor (C1_1) formed by the electrode and the inner electrically conductive sheet of the switch gear voltage sensor, the second capacitor being in parallel to the first capacitor, generate a third signal (V1) at an output of the measurement resistor based on the first signal, and generate a fourth signal (V2) at an input of the compensation capacitor based on the second signal;

an electronic processor configured to
receive the third signal and the fourth signal,
determine an angular frequency of the third signal (V1),
determine a phase difference between the third signal (V1) and the fourth signal (V2),
determine a resistance value based on the angular frequency and the phase difference,
determine a capacitor voltage across the compensation capacitor,
determine an initial gain based on a line voltage, a capacitance of the second capacitor, a capacitance of the compensation capacitor, and the capacitor voltage,
determine a final gain based on the resistance value, the angular frequency, and the phase difference, and
determine a drift value of the fourth signal based on the final gain.

2. The system of claim 1, further comprising an amplifier configured to generate an output signal (Vout) based on the initial gain, the final gain, the capacitance of the second capacitor, the capacitance of the compensation capacitor, the drift value, and the line voltage.

3. The system of claim 1, wherein the switch gear voltage sensor is a high voltage epoxy casting switchgear sensor.

4. The system of claim 1, wherein the third signal (V1) is a voltage across the measurement resistor and the fourth signal (V2) is a voltage across the compensation capacitor (C2).

5. The system of claim 1, wherein at least one of the group consisting of the angular frequency, the phase difference, the resistance value, the capacitor voltage across the compensation capacitor, the initial gain, the final gain, and the drift value are determined by the electronic processor based on receiving data from a memory associated with the electronic processor.

6. The system of claim 1, wherein the electronic processor is configured to receive instructions that, when executed by the electronic processor, determine at least one of the group consisting of the angular frequency, the phase difference, the resistance value, the capacitor voltage across the compensation capacitor, the initial gain, the final gain, and the drift value.

7. The system of claim 1, wherein the electronic processor is further configured to receive data from a measurement device, the measurement device configured to generate measurement data associated with at least one of the group consisting of the angular frequency, the phase difference, and the capacitor voltage across the compensation capacitor.

8. The system of claim 2, wherein the electronic processor is further configured to
determine a determined gain value based on at least one of the group consisting of the initial gain and the final gain, and
provide the determined gain value to the amplifier, wherein the amplifier is configured to apply the determined gain value to the fourth signal.

9. The system of claim 8, wherein the electronic processor is further configured to the determine the determined gain value on a periodic basis.

10. The system of claim 8, wherein the electronic processor is further configured to the determine the determined gain value based on determining a change in a capacitance of the first capacitor (C1_2).

11. A method for compensating for drift in a switch gear voltage sensor, the method comprising:
receiving, at a circuit including a compensation capacitor and a voltage divider including a measurement resistor and a divider resistor, the compensation capacitor being in parallel with the voltage divider, a first signal (Input 1) from a first capacitor of the voltage sensor (C1_2) formed by an electrode and an inner electrically conductive sheet of the switch gear voltage sensor, the first signal (Input 1) being received at the measurement resistor,
receiving, via the circuit, a second signal (Input 2) from a second capacitor of the voltage sensor (C1_1) formed by the electrode and the inner electrically conductive sheet of the switch gear voltage sensor, the second capacitor being in parallel to the first capacitor, the second signal (Input 2) at the compensation capacitor, the second capacitor being in parallel to the first capacitor,
generating, via the circuit, a third signal (V1) at an output of the measurement resistor based on the first signal,
generating, via the circuit, a fourth signal (V2) at an input of the compensation capacitor based on the second signal;
receiving, via an electronic processor, the third signal and the fourth signal,
determining, via the electronic processor, an angular frequency of the third signal (V1),
determining, via the electronic processor, a phase difference between the third signal (V1) and the fourth signal (V2),
determining, via the electronic processor, a resistance value based on the angular frequency and the phase difference,
determining, via the electronic processor, a capacitor voltage across a compensation capacitor,
determining, via the electronic processor, an initial gain based on a line voltage, a capacitance of the second capacitor, a capacitance of the compensation capacitor, and the capacitor voltage,
determining, via the electronic processor, a final gain based on the resistance value, the angular frequency, and the phase difference, and
determining, via the electronic processor, a drift value of the fourth signal based on the final gain.

12. The method of claim 11, further comprising:
generating, via an amplifier, an output signal (Vout) based on the initial gain, the final gain, the capacitance of the second capacitor, the capacitance of the compensation capacitor, the drift value, and the line voltage.

13. The method of claim 11, wherein the switch gear voltage sensor is a high voltage epoxy casting switchgear sensor.

14. The method of claim 11, further comprising determining, via the electronic processor, at least one of the group consisting of the angular frequency, the phase difference, the resistance value, the capacitor voltage across the compensation capacitor, the initial gain, the final gain, and the drift value based on receiving data from a memory associated with the electronic processor.

15. The method of claim 11, further comprising:
receiving, via the electronic processor, instructions that, when executed by the electronic processor, determine at least one of the group consisting of the angular frequency, the phase difference, the resistance value, the capacitor voltage across the compensation capacitor, the initial gain, the final gain, and the drift value.

16. The method of claim 11, further comprising:
receiving, via the electronic processor, data from a measurement device, the measurement device configured to generate measurement data associated with at least one of the group consisting of the angular frequency, the phase difference, and the capacitor voltage across the compensation capacitor.

17. The method of claim 12, further comprising:
determining, via the electronic processor, a determined gain value based on at least one of the group consisting of the initial gain and the final gain, and
providing, via the electronic processor the determined gain value to the amplifier wherein the amplifier is configured to apply the determined gain value to the fourth signal to compensate for the drift value.

18. The method of claim 17, further comprising:
determining the determined gain value on a periodic basis.

19. The method of claim 17, wherein the electronic processor is further configured to the determine the determined gain value based on determining a change in a capacitance of the first capacitor ($C1\_2$).

20. A system for compensating for drift in a switch gear voltage sensor, the system comprising:
an electronic processor configured to
receive a first signal (V1) from a first capacitor of the switch gear voltage sensor ($C1\_2$) formed by an electrode and an inner electrically conductive sheet of the switch gear voltage sensor,
receive a second signal (V2) from a second capacitor of the switch gear voltage sensor formed by the electrode and the inner electrically conductive sheet of the switch gear voltage sensor, the second capacitor being in parallel to the first capacitor,
determine an angular frequency of the first signal (V1),
determine a phase difference between the first signal (V1) and the second signal (V2),
determine a resistance value based on the angular frequency and the phase difference,
determine a capacitor voltage across a compensation capacitor,
determine an initial gain based on a line voltage, a capacitance of a second capacitor, a capacitance of the compensation capacitor, and the capacitor voltage,
determine a final gain based on the resistance value, the angular frequency, and the phase difference,
determine a drift value of the second signal based on the final gain, and
apply a determined gain compensating for the drift value of the second signal.

* * * * *